United States Patent [19]
French

[11] Patent Number: 4,544,924
[45] Date of Patent: Oct. 1, 1985

[54] ON-OFF ARRANGEMENT IN A MICROPROCESSOR CONTROLLED REMOTE TRANSMITTER FOR A CONSUMER INSTRUMENT

[75] Inventor: Michael P. French, Indianapolis, Ind.

[73] Assignee: RCA Corporation, Princeton, N.J.

[21] Appl. No.: 452,115

[22] Filed: Dec. 22, 1982

[51] Int. Cl.$^4$ ........................... H04Q 9/00; G06F 1/00
[52] U.S. Cl. ............................... 340/825.69; 307/140; 340/365 S; 455/127
[58] Field of Search .............. 340/711, 825.69, 309.15, 340/696, 825.64, 365 R, 365 S; 84/1.01, 1.17; 307/100, 141, 142, 139, 140; 318/470; 364/141, 140, 143, 189, 707; 365/227; 455/127, 603, 613, 618; 358/194.1

[56] References Cited
U.S. PATENT DOCUMENTS

| | | | |
|---|---|---|---|
| 3,671,659 | 6/1972 | Suzuki | 84/1.17 |
| 4,259,594 | 3/1981 | Fox et al. | 364/707 X |
| 4,271,404 | 6/1981 | Tanaka . | |
| 4,276,483 | 6/1981 | Hayden | 307/141 X |
| 4,291,261 | 9/1981 | Johnston | 307/142 X |
| 4,362,954 | 12/1982 | Cotton . | |
| 4,381,459 | 4/1983 | Cotton . | |
| 4,418,416 | 11/1983 | Lese et al. . | |
| 4,463,646 | 8/1984 | Mitarai . | |

OTHER PUBLICATIONS

COPS Microcontrollers Databook, 1982, by National Semiconductor Corporation.
Page 23 of RCA Corporation "Color Television Basic Service Data-CTC-111 Series", copyright 1982 and published in Apr. 1982.

Primary Examiner—Ulysses Weldon
Attorney, Agent, or Firm—Eugene M. Whitacre; Paul J. Rasmussen; Joseph J. Laks

[57] ABSTRACT

In a battery operated, remote transmitter for a consumer instrument, a microprocessor controls operation of the transmitter. The collector current path of an on-off transistor is coupled between the battery and a voltage supply terminal of the microprocessor. To power up the microprocessor, a keyboard switch in the transmitter is depressed to activate a separate latch that is coupled to the base of the on-off transistor. Base current flows to the latch to turn on the transistor and apply the battery voltage to the voltage supply terminal of the microprocessor. After completion of the transmitter signaling, the microprocessor switches an output port to the ground state. The output port is coupled to a control terminal of the latch and bypasses holding current from a portion of the latch to initiate the regenerative deactivation of the latch. With the latch deactivated, conduction of the on-off transistor is cut off. The voltage supply terminal of the microprocessor is disconnected from the battery to power down the remote transmitter.

16 Claims, 1 Drawing Figure

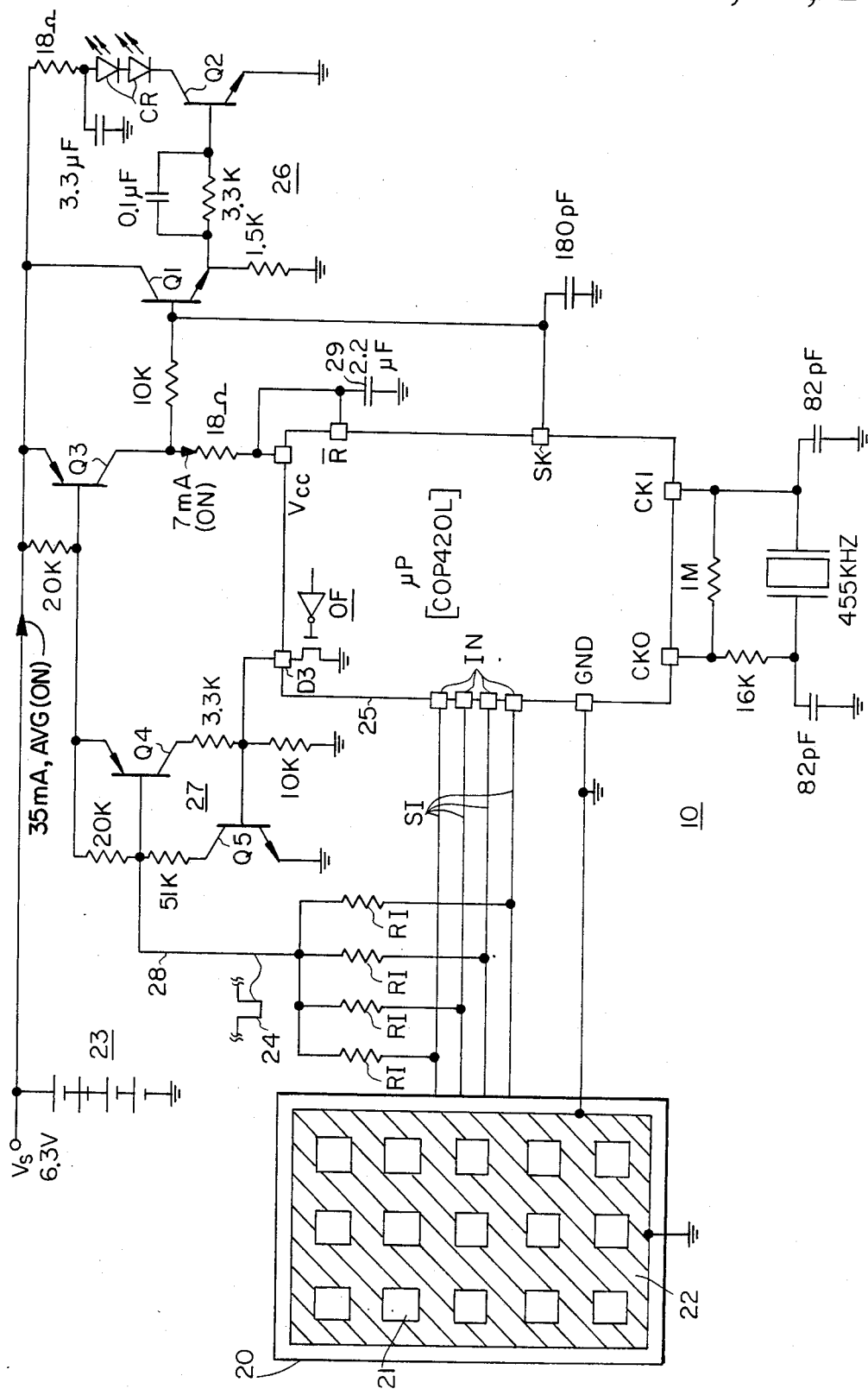

ON-OFF ARRANGEMENT IN A MICROPROCESSOR CONTROLLED REMOTE TRANSMITTER FOR A CONSUMER INSTRUMENT

This invention relates to an on-off arrangement for a digital controller, such as a microprocessor, that, e.g., controls operation of a remote transmitter in a consumer instrument.

The remote transmitter of a consumer instrument, such as a color television receiver or a video disc player, is battery operated and controlled in operation by a microprocessor. To conserve battery power, the remote transmitter is powered up only during those intervals when a command signal for the instrument remote receiver circuitry is being generated by the transmitter.

In a typical keyboard transmitter arrangement, an electrically conductive contact sheet is connected to electrical ground. Each of the keyboard switches is positioned over the contact sheet and spaced apart from it. Signal lines from input ports of the microprocessor are connected to the keyboard switches.

When a keyboard switch corresponding to a given function or command to be transmitted is depressed, the switch makes electrical connection to the grounded contact sheet thereby grounding the signal line or lines connected to that switch. The input port or ports of the microprocessor that are connected to the signal lines become grounded to provide an indication to the microprocessor that the particular command is to be transmitted.

To power up the microprocessor when any of the keyboard switches are depressed, each of the signal lines connected to the switches is also connected to the control terminal of an on-off transistor switch. The collector to emitter path of the transistor is connected between the battery that generates, illustratively, 6.3 volts of operating voltage and the voltage supply terminal of the microprocessor. When a signal line is grounded to the contact sheet, the control terminal of the on-off transistor switch is also grounded, turning on the transistor and enabling main power to be supplied from the battery to the voltage supply terminal of the microprocessor.

After the command has been transmitted by the remote transmitter, it is desirable to power down the microprocessor and associated transmitter circuitry to conserve battery power. The microprocessor itself provides a power down command signal by, for example, internally grounding an output port.

In the concurrently filed U.S. patent application of Ser. No. 452,114, of H. Blatter and J. E. Amaral, entitled MICROPROCESSOR SELF-TURN-OFF ARRANGEMENT FOR A CONSUMER INSTRUMENT, the on-off switching transistor is part of a two transistor latch that has a control terminal coupled to the aforementioned output port of the microprocessor. When the output port is grounded, the latch is deactivated to turn off the switching transistor, thereby powering down the microprocessor.

With the switching transistor cut-off, the voltage at the microprocessor supply terminal begins to decay from its on-state value of 6.3 volts. The operating characteristics of the microprocessor, such as the ability of an output port to sink current, may become unpredictable when the voltage at the supply terminal decays below a given value, such as below 4.5 volts.

A feature of the invention is a latching arrangement that ensures reliable microprocessor turn-off, by reliably maintaining the on-off transistor in cutoff during the entire interval that the supply voltage is decaying to zero volts. In accordance with an aspect of the invention, the on-off transistor is not part of the regenerative feedback arrangement of the latch configuration. The off-command of the microprocessor is applied to a control terminal of the latch. The keyboard switch input signal lines are connected to another control terminal of the latch. A main current terminal of the latch is coupled to the control terminal of the on-off transistor switch.

Grounding an input signal line activates the latch and also enables base current to flow to turn on the on-off transistor switch. An off-command signal from the microprocessor deactivates the latch, preventing base current from flowing in the on-off transistor switch to power down the microprocessor. With this on-off latch control arrangement, battery power is conserved because the battery is connected to the voltage supply terminal of the microprocessor only during the generation of a command signal. Also, reliable self-turnoff or self-powering down of the microprocessor is assured once the off-command signal is generated.

The sole drawing FIGURE illustrates a remote control transmitter for a consumer instrument including on-off circuitry embodying the invention.

In the battery operated, microprocessor controlled, remote transmitter 10, illustrated in the FIGURE, each contact switch 21 of a keyboard assembly 20 is coupled to one or more of a plurality of signal lines SI connecting the contact switches to a plurality of input ports IN of a digital controller, microprocessor 25. By way of example, only four signal lines and input ports are illustrated in the FIGURE. In practice, between ten and twenty signal lines and input ports may be provided. Microprocessor 25 may be selected as a COP420L, manufactured by National Semiconductor Corporation, Santa Clara, Calif.

Keyboard assembly 20 includes an electrically conductive contact sheet 22 electrically connected to the ground terminal of the remote transmitter circuitry. Alternatively, contact sheet 22 may be constructed as a plastic, nonconductive sheet with electrically conductive conductor lines printed thereon and electrically connected to ground. Contact sheet 22 is located below and spaced apart from each contact switch 21. Depressing a contact switch grounds the associated signal line or lines and therefore grounds the corresponding input port or ports.

To transmit a particular command signal, such as a "CHANNEL SCAN" command signal for sequentially selecting channels, when the remote transmitter is part of a remote controlled television receiver, or such as a "PLAY" or "PAUSE" command signal to play back, to stop and start, respectively, when the remote transmitter is part of a remote controlled video disc or tape player, the operator depresses the appropriate one of the contact switches 21 that represents the command signal to be transmitted. The corresponding signal line or lines SI are grounded, thereby grounding the corresponding input port or ports IN.

Microprocessor 25 interrogates the switching states of the input ports IN. Upon determining that a particular combination of input ports are in the low or ground state, microprocessor 25 generates at an output port SK a serial flow of coded pulses corresponding to the command selected by the operator. These pulses are applied to the transmitting portion 26 of remote transmitter 10. When output port SK is in the low state, the port is grounded through the conducting source-drain path of an MOS transistor of the output interface circuitry associated with the port and not illustrated in the FIGURE. Accordingly, transistors Q1 and Q2 are cut off, preventing current from flowing in light emitting diodes CR. When output port SK is in the high state, transistor Q1 turns on, turning on transistor Q2 to enable current to flow in light emitting diodes CR. In this manner, coded signal pulses at terminal SK, representing a given command, are converted by the light emitting diode transducers into coded light pulses for reception by the remote receiver.

Main power for remote transmitter 10 is obtained from a battery 23. The power is supplied through the main current conduction, collector-to-emitter path of an on-off, PNP, switching transistor Q3. The collector of transistor Q3 is coupled to the base of transistor Q1 to control the energization of transmitting portion 26. The collector of transistor Q3 is also coupled to the $V_{cc}$ voltage supply terminal that provides power to microprocessor 25.

In the powered down state of remote transmitter 10, transistor Q3 is non-conductive, disconnecting battery 23 from microprocessor 25 and from the control terminal of transmitting portion 26. No significant power is drained from battery 23 in the powered down state.

Remote transmitter 10 is powered up when a keyboard contact switch 21 is depressed. Signal lines SI are coupled through respective resistors RI to a signal line 28 to a control terminal of an on-off control latch 27. Depressing any contact switch 21 generates an on-command signal 24 along signal line 28 during the time that the contact switch is depressed. Base currents begin to flow in a PNP transistor Q4 of latch 27 and in on-off transistor Q3. The base current from transistor Q3 flows in the collector-to-emitter path of transistor Q4 and then into the base of an NPN transistor Q5 of latch 27, which transistor has its collector connected to the base of transistor Q4 to regeneratively turn on or activate the latch. The base current from transistor Q3 functions as the sustaining or holding current of latch 27.

With latch 27 maintaining transistor Q3 forward biased into conduction, the battery voltage $V_s$ is applied to the $V_{cc}$ terminal to power up microprocessor 25. The $V_{cc}$ terminal is coupled to a capacitor 29 and to a RESET-BAR input port $\overline{R}$ of microprocessor 25. After microprocessor 25 is powered up, the programming of the microprocessor is such that an output port D3 is switched to the high state by the open-drain interface circuitry OF, illustrated in the FIGURE. Output port D3 is coupled to a control terminal of latch 27 at the base of transistor Q5.

Upon completion of the command signal transmission, microprocessor 25 switches the output state of port D3 to the low state by means of the conduction of the enhancement-mode MOS transistor in the output interface circuitry OF, thereby grounding output port D3. With output port D3 grounded, the main portion of the latch sustaining current that flows in the collector-to-emitter path of transistor Q4 is diverted from the base of transistor Q5 through port D3 and the MOS transistor of interface circuitry OF.

The creation of this alternate current path for the latch holding current that bypasses the base of transistor Q5 initiates the regenerative deactivation of the latch, turning off transistors Q4 and Q5. The path to ground for base current in transistor Q3 is disabled by the deactivation of latch 27 to cut off conduction of on-off switching transistor Q3. Battery 23 is disconnected from the $V_{cc}$ voltage supply terminal of microprocessor 25. Capacitor 29 discharges into the $V_{cc}$ terminal, and the $\overline{R}$ input port. Microprocessor 25 powers down as the voltage at the $V_{cc}$ terminal decays.

In the inventive arrangement just described, the magnitude of the latch holding current is merely that of the relatively small magnitude base current of transistor Q3. Output port D3 of microprocessor 25 therefore must sink only a relatively small magnitude current in order to initiate the sequence of events that disconnects battery 23 from the $V_{cc}$ voltage supply terminal.

Once latch 27 is deactivated and Q3 becomes nonconductive, the relatively slow decay of the supply voltage at the $V_{cc}$ terminal has no adverse effects on reliably maintaining battery 23 disconnected from the $V_{cc}$ supply terminal during the decay interval. Although the characteristics of output port D3, such as the capability of sinking current to ground, cannot be assured when the voltage at terminal $V_{cc}$ decreases below a certain minimum value, any change of state in output port D3 as the voltage at supply terminal $V_{cc}$ decays, such as a change of state of the MOS interface transistor from the conductive state to the open-drain state, cannot erroneously turn transistor Q3 back on. This result follows because latch 27 has already been regeneratively turned off.

What is claimed is:

1. An on-off arrangement for a digital controller operated by a microprocessor in a power-up condition, comprising:

a DC power supply for developing a DC voltage at a DC voltage supply terminal of said digital controller for providing main power thereto;

a semiconductor switch having a main current path coupled between said DC voltage supply terminal and a supply terminal of said microprocessor, conduction in said main current path being controlled by the conduction in a control current path of said switch such that when a control current flows in said control current path, conduction in said main current path is enabled;

a latching arrangement exclusive of said switch coupled to the control current path of said switch for receiving said control current when said latching arrangement is energized;

means responsive to a turn-on signal for energizing said latching arrangement to receive said control current for initiating the conduction of current in the main current path of said semiconductor switch from said DC voltage supply terminal to the microprocessor supply terminal to power-up said microprocessor and activate said digital controller;

an output port of said microprocessor coupled to a first control terminal of said latching arrangement, said microprocessor switching the state of said output port to provide an alternate path for current via said output port that bypasses at least a portion of said latching arrangement for initiating a regenerative deenergization thereof to cut off conduction in the main current path of said semiconductor switch to power-down said microprocessor.

2. An arrangement according to claim 1 wherein said energizing means comprises a turn-on switch coupled to a source of reference potential and to a second control terminal of said latching arrangement, said turn-on switch, when made conductive, applying said reference potential to said second control terminal to energize said latching arrangement.

3. An arrangement according to claim 2 wherein said output port is coupled to interface circuitry that provides said alternate path when said microprocessor switches the state of said output port.

4. An arrangement according to claim 2 wherein said turn-on switch comprises a keyboard contact switch coupled to said source of reference potential and to said second control terminal.

5. An arrangement according to claim 4 wherein said source of reference potential comprises electrical ground and said keyboard contact switch represents a given command operation, and wherein said keyboard contact switch is coupled to an input port of said microprocessor in order to ground said input port when said contact switch is actuated to enable said microprocessor to identify said given command operation.

6. An arrangement according to claim 5 including a signal port of said microprocessor for developing thereat a coded output signal representative of said given command operation when said contact switch is actuated.

7. An arrangement according to claim 6 wherein said microprocessor switches the state of said output port to bring the output port to ground after completion of the generation of said coded output signal.

8. An arrangement according to claim 7 including a signal transducer responsive to said coded output signal for transmitting to a receiving unit a signal representative of said command operation.

9. An arrangement according to claim 1 wherein said output port is coupled to interface circuitry of said microprocessor that sinks latch current to deactivate said latching arrangement when said microprocessor changes the state of said output port.

10. An arrangement according to claim 9 including a signal port of said microprocessor for developing thereat a coded output signal, said microprocessor changing the state of said output port upon completion of said coded output signal.

11. An arrangement according to claim 10 including a signal transducer responsive to said coded output signal for transmitting to a receiving unit a signal representative of said coded output signal.

12. An arrangement according to claim 1 wherein said latching arragement comprises first and second switches, each having an output coupled to a control terminal of the other to provide regenerative switching of the two latch switches, the control terminal of the first latch switch comprising the aforementioned first control terminal of said latching arrangement.

13. An arrangement according to claim 12 wherein said microprocessor includes interface circuitry that has an MOS transistor arranged in an open drain configuration and coupled between said output port and a point of reference potential for bypassing current from the control terminal of the first latch switch.

14. An arrangement according to claim 12 wherein said latch energizing means is coupled to the control terminal of the second latch switch for applying a turn-on signal thereto to energize said latching arrangement.

15. An arrangement according to claim 13 wherein said semiconductor switch comprises a PNP transistor and wherein said first and second latch switches comprises an NPN and a PNP transistor, respectively, the base of said PNP semiconductor switch being coupled to the emitter of said second, PNP, latch switch, wherein said source of supply voltage comprises a battery and including a signal port of said microprocessor for developing a coded output signal and a signal transducer responsive to said coded output signal for transmitting to a receiving unit a signal representative of said coded output signal.

16. An on-off arrangement for a television remote control transmitter that includes a microprocessor for controlling the operation thereof, comprising:
a DC power supply for developing a DC voltage at a DC voltage supply terminal;
a semiconductor switch having a main current path coupled between said DC voltage supply terminal and a supply terminal at said microprocessor, conduction in said main current path being controlled by the conduction in a control current path of said switch such that when a control current flows in said control current path, conduction in said main current path is enabled;
a latching arrangement exclusive of said switch coupled to the control current path of said switch for receiving said control current when said latching arrangement is energized;
a transmitting circuit activated by said microprocessor for generating a television remote control signal and so coupled to said DC power supply to draw current therefrom when activated and to draw no current therefrom during standby;
means responsive to a turn-on signal for energizing said latching arrangement to receive said control current for initiating the conduction of current in the main current path of said semiconductor switch to the microprocessor supply terminal to power-up said microprocessor; and
an output port of said microprocessor coupled to a first control terminal of said latching arrangement, said microprocessor switching the state of said output port to provide an alternate path for current via said output port that bypasses at least a portion of said latching arrangement for initiating a regenerative deactivation thereof to cut off conduction in the main current path of said semiconductor switch to power-down said microprocessor, said microprocessor drawing no current from said DC power supply during standby.

* * * * *